(12) United States Patent
Fukushige et al.

(10) Patent No.: US 11,056,635 B2
(45) Date of Patent: Jul. 6, 2021

(54) ELECTRONIC COMPONENT HOUSING PACKAGE, ELECTRONIC DEVICE, AND ELECTRONIC MODULE

(71) Applicant: KYOCERA Corporation, Kyoto (JP)

(72) Inventors: Motoki Fukushige, Kyoto (JP); Keisuke Sawada, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/630,016

(22) PCT Filed: Jul. 19, 2018

(86) PCT No.: PCT/JP2018/027147
§ 371 (c)(1),
(2) Date: Jan. 10, 2020

(87) PCT Pub. No.: WO2019/017441
PCT Pub. Date: Jan. 24, 2019

(65) Prior Publication Data
US 2020/0136011 A1 Apr. 30, 2020

(30) Foreign Application Priority Data
Jul. 21, 2017 (JP) .............................. JP2017-141948

(51) Int. Cl.
*H01L 41/053* (2006.01)
*H01L 41/047* (2006.01)
*H01L 21/48* (2006.01)

(52) U.S. Cl.
CPC ...... *H01L 41/0533* (2013.01); *H01L 21/4867* (2013.01); *H01L 41/0475* (2013.01)

(58) Field of Classification Search
CPC ............. H01L 41/0533; H01L 21/4867; H01L 41/0475; H03H 9/02; H03H 9/10
See application file for complete search history.

(56) References Cited

U.S. PATENT DOCUMENTS 10,009,004 B2 * 6/2018 Yamashita ........... H03H 9/0552
10,103,709 B2 * 10/2018 Miura .................. H03H 9/1021
10,205,434 B2 * 2/2019 Kaida ...................... H03H 9/10
(Continued)

FOREIGN PATENT DOCUMENTS

JP 08-107328 A 4/1996
JP 10-022776 A 1/1998
(Continued)

*Primary Examiner* — Rockshana D Chowdhury
(74) *Attorney, Agent, or Firm* — Volpe Koenig

(57) ABSTRACT

An electronic component housing package includes: a base section having a mounting section for an electronic component; a projecting part that is positioned on the base section and projects from the base section; a frame part that is positioned on the base section and surrounds the mounting section; a frame-shaped metalized layer that is positioned on the frame part; a plurality of external connection conductors that is positioned opposite the mounting section in the thickness direction; a connection conductor which is positioned on the projecting part and for connecting to the electronic component; and a wiring conductor that is connected to the connection conductor and that is led out to the base section. The thickness of the connection conductor gradually increases toward the wiring conductor.

7 Claims, 3 Drawing Sheets

(56) References Cited

U.S. PATENT DOCUMENTS

| | | | |
|---|---|---|---|
| 10,224,904 B2* | 3/2019 | Fukuzawa | H03B 5/368 |
| 2008/0265717 A1 | 10/2008 | Iizuka et al. | |
| 2008/0290956 A1* | 11/2008 | Horie | H03H 9/0547 |
| | | | 331/68 |

FOREIGN PATENT DOCUMENTS

| | | |
|---|---|---|
| JP | 2000-353919 A | 12/2000 |
| JP | 2003-318692 A | 11/2003 |
| JP | 2005-109794 A | 4/2005 |
| JP | 2008-244838 A | 10/2008 |
| JP | 2013-207527 A | 10/2013 |
| JP | 2016-021768 A | 2/2016 |
| JP | 2016-123114 A | 7/2016 |

* cited by examiner

...
ELECTRONIC COMPONENT HOUSING PACKAGE, ELECTRONIC DEVICE, AND ELECTRONIC MODULE

TECHNICAL FIELD

The present invention relates to an electronic component housing package that houses an electronic component such as a piezoelectric vibrator or a semiconductor element, an electronic device, and an electronic module.

BACKGROUND ART

Nowadays, an electronic component housing package for mounting an electronic component such as a piezoelectric vibrator or a semiconductor element is used. Typically, in such an electronic component housing package, a portion that houses an electronic component on an insulating substrate formed of, for example, a ceramic sintered body is closed by a lid body and airtightly sealed. Such an electronic component housing package basically includes, for example, an insulating substrate, a metalized layer, and wiring conductor. The insulating substrate includes a lower insulating layer and an upper insulating layer. The lower insulating layer has a flat-plate shape and includes a mounting section for electronic component on an upper surface thereof. The upper insulating layer has a frame shape and is superposed on the lower insulating layer so as to surround the mounting section. The metalized layer has a frame shape and serves as a surface for joining to a lid body. The metalized layer is formed on an upper surface of the insulating substrate. The wiring conductor is formed in a region from the mounting section to, for example, a lower surface of the lower insulating layer. After the electronic component has been mounted on a plurality of connection conductors in the mounting section and electrodes of the electronic component have been electrically connected to the connection conductors, the lid body formed of metal is joined, with a brazing alloy or the like, to an upper surface of the frame-shaped metalized layer on a frame part, and the electronic component is airtightly sealed in a housing including the insulating substrate and the lid body. Thus, an electronic device is fabricated. If the electronic component is, for example, a piezoelectric vibrator, the connection conductors on which the electronic component is to be mounted are disposed on an upper surface of a step portion in some cases (for example, see Japanese Unexamined Patent Application Publication No. 2013-207527).

SUMMARY OF INVENTION

An electronic component housing package according to the present disclosure includes a base section that includes a mounting section for an electronic component, a projecting part that is positioned on the base section and projects from the base section, a frame part that is positioned on the base section and surrounds the mounting section, a frame-shaped metalized layer that is positioned on the frame part, a plurality of external connection conductors that is positioned opposite the mounting section in a thickness direction, a connection conductor which is positioned on the projecting part and for connecting to the electronic component, and a wiring conductor that is connected to the connection conductor and that is led out to the base section, wherein a thickness of the connection conductor gradually increases toward the wiring conductor.

An electronic device according to the present disclosure includes the above-described electronic component housing package and the electronic component that is mounted in the electronic component housing package.

An electronic module according to the present disclosure includes the above-described electronic device and a module substrate to which the electronic device is connected.

DESCRIPTION OF EMBODIMENTS

Figure 1:
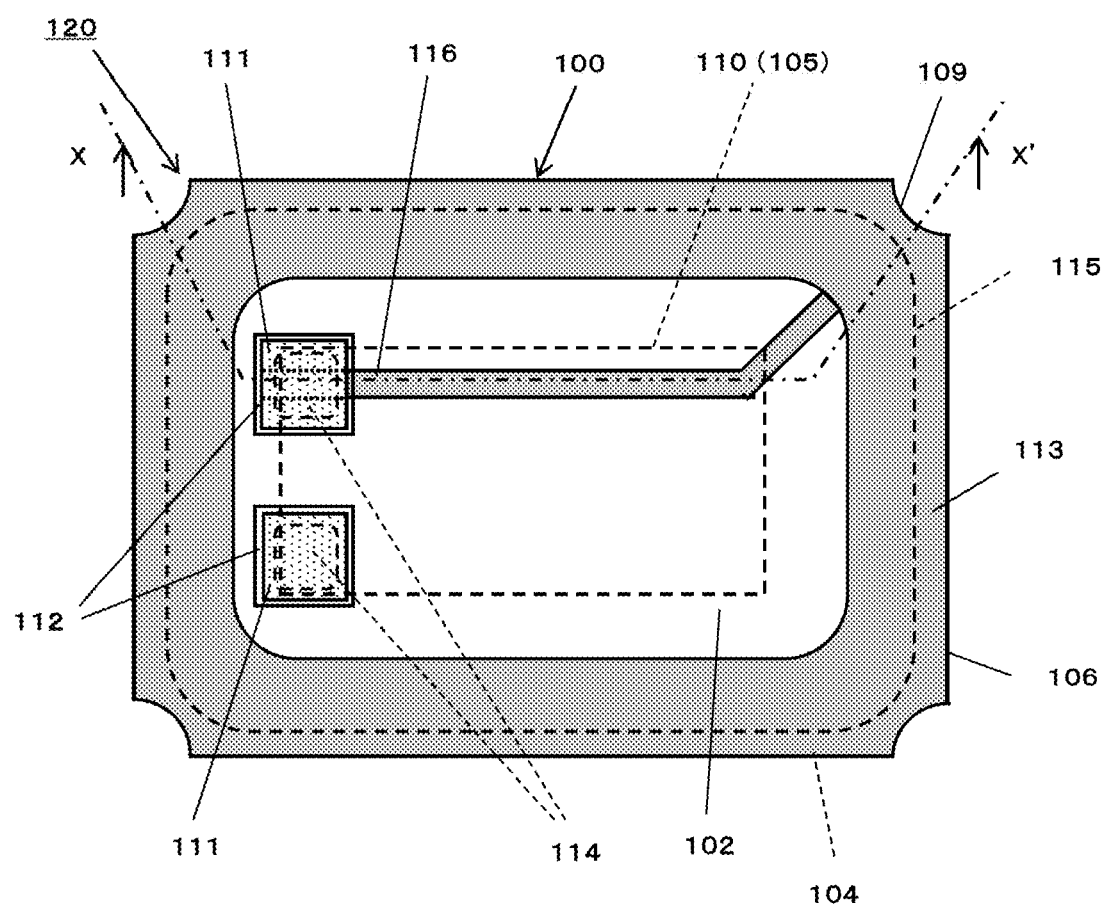
FIG. 1 illustrates an electronic component housing package and so forth according to an embodiment seeing through the top of the electronic component housing package.
Figure 2:
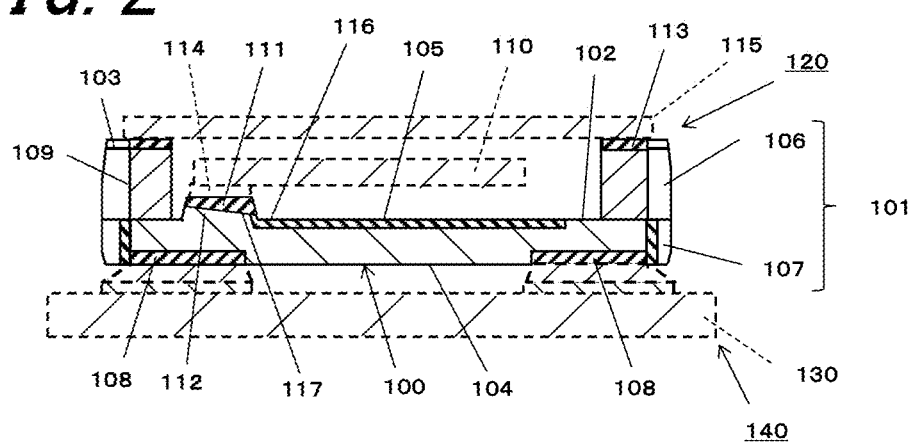
FIG. 2 is a longitudinal sectional view of the electronic component housing package and so forth according to the present embodiment taken along line X-X' illustrated in FIG. 1.

An electronic component housing package and so forth according to the present disclosure is described with reference to the accompanying drawings. FIG. 1 illustrates an example of an embodiment of the electronic component housing package according to the present disclosure seeing through an upper surface of the electronic component housing package. FIG. 2 is a longitudinal sectional view of the electronic component housing package taken along line X-X' illustrated in FIG. 1.

Referring to FIG. 1, an insulating substrate 101 includes a frame part 106 and a base section 107. The frame part 106 and the base section 107 are superposed on each other. For example, cutout portions 109 are disposed at side surfaces of the insulating substrate 101. Side conductors are disposed in the cutout portions 109. An electronic component housing package 100 includes the base section 107 and the frame part 106. The base section 107 includes a first main surface 102, a mounting section 105 for an electronic component 110, and a third main surface 104 disposed opposite the first main surface 102 on a side for attachment to a module substrate 130. The frame part 106 includes a second main surface 103 and is disposed on a sealing side. The electronic component 110 such as a piezoelectric vibrator is to be mounted on the mounting section 105.

External connection conductors 108 connected to the side conductors are disposed on a lower surface side of the insulating substrate 101. A wiring substrate (electronic component housing package 100) of the present example also includes a frame-shaped metalized layer 113 on an upper surface of the frame part 106, connection conductors 111 that is positioned in the base section 107 and for connecting to the electronic component 110, and wiring conductors 116 extending from the connection conductors 111. Regarding the electronic component housing package 100, a lid body 115 is joined to an upper portion of the insulating substrate 101 by using a sealing material such as silver solder (not illustrated), thereby the electronic component 110 is airtightly sealed.

According to the present embodiment, the insulating substrate 101 is partially recessed in section in the thickness direction. An electronic device 120 is formed by airtightly sealing the electronic component 110 such as a piezoelectric vibrator in the electronic component housing package 100. The lid body 115 that seals the mounting section 105 is transparent in FIG. 1 for ease of seeing.

In the insulating substrate 101, the frame part 106 is superposed on the flat-plate shaped base section 107. In plan view, the frame part 106 surrounds the mounting section 105 on the upper surface of the base section 107. Side surfaces of the frame part 106 and the base section 107 exposed in the frame part 106 form a recessed shape in which the mounting section 105 for mounting the electronic component 110 is provided.

The frame part 106 and the base section 107 are formed of a ceramic material such as, for example, an aluminum oxide sintered body, an aluminum nitride sintered body, a mullite sintered body, or a glass-ceramic sintered body. The external shape of the entirety of the insulating substrate 101 is, for example, a rectangular shape in plan view having the sides the length of which is about 1.2 to 10 mm. The entirety of the insulating substrate 101 has a plate shape having a thickness of about 0.2 to 2 mm. The upper surface of the insulating substrate 101 has the recessed shape formed by the frame part 106 and the base section 107. If the frame part 106 and the base section 107 are formed of an aluminum oxide sintered body, the insulating substrate 101 is fabricated as follows: an appropriate organic binder, an appropriate solvent, an appropriate plasticizer, and the like are added to and mixed with material particles of aluminum oxide, silicon oxide, magnesium oxide, calcium oxide, and the like to obtain a slurry; this slurry is subjected to a sheet forming method such as, for example, a doctor blade method or a roll calendar method to be formed into a sheet shape. Thus, a plurality of ceramic green sheets is obtained; next, a subset of the ceramic green sheets is formed to have a frame shape by being subjected to an appropriate punching process; The ceramic green sheets are superposed in the up-down direction such that the frame-shaped ceramic green sheets are respectively positioned on upper surfaces of the flat plate-shaped ceramic green sheets not having been formed into the frame shape and then fired at high temperature.

For example, the insulating substrate 101 is fabricated by producing a matrix substrate in which substrate regions that respectively become individual insulating substrates 101 are arrayed and dividing the produced matrix substrate into the individual substrate regions. The matrix substrate includes a flat plate-shaped insulating layer including a plurality of regions that become base sections 107 and an insulating layer including a plurality of regions that respectively become frame parts 106 (a plurality of openings is arrayed). These insulating layers are superposed one on top of the other.

The frame part 106 includes the frame-shaped metalized layer 113 at the upper surface thereof and may have the cutout portions 109 at outer side surfaces thereof. The base section 107 includes the connection conductors 111, the wiring conductors 116, the side conductors, and the external connection conductors 108 serving as conductor paths through which the electronic component 110 to be mounted on the mounting section 105 and an external electric circuit in the module substrate 130 are electrically connected to one another. Although the cutout portions 109 are disposed at corner portions of the insulating substrate 101 in the example herein, the cutout portions 109 may be disposed at the long sides or the short sides being other positions of the outer side surfaces of the insulating substrate 101 than the corner portions. The side conductors may be changed to through conductors or the like to obtain the insulating substrate 101 without the cutout portions 109.

If a plurality of electronic components such as a temperature compensated crystal oscillator (TCXO) and so forth (not illustrated) are to be mounted on the mounting section 105 of the electronic device, the frame part 106 may include two of more insulating layers so that the frame part 106 has stepped inner side surfaces for mounting the plurality of electronic components.

For example, the mounting section 105 has a quadrangular shape in plan view to follow the quadrangular electronic component 110. Likewise, a bottom portion of the recessed portion of the insulating substrate 101 has a quadrangular shape. In the example illustrated in FIG. 1, a pair of connection conductors 111 is disposed at two corner portions adjacent to each other at the bottom portion of the recessed portion. The connection conductors 111 function as a conductor layer to which electrodes of the electronic component 110 such as a piezoelectric vibrator to be mounted on the mounting section 105 are connected. If the electronic component 110 is a piezoelectric vibrator, the external shape is typically a quadrangular shape in plan view, and a pair of electrodes (not illustrated) for connection is disposed at the corner portions. In order to connect such electrodes easily and reliably, the connection conductors 111 are disposed at the corner portions of the bottom portion of the recessed portion.

The electrodes of the electronic component 110 and the connection conductors 111 are connected to one another by using a joining material 114 such as an electrically conductive adhesive. That is, as illustrated in FIG. 1, the electronic component 110 is positioned in the mounting section 105 such that a pair of electrodes at corner portions of the main surface of the electronic component 110 faces the pair of connection conductors 111 in the mounting section 105, and the joining material 114 having adhered to the connection conductors 111 in advance is heated and cured. Thus, the electrodes of the electronic component 110 and the connection conductors 111 are connected to each other. If the electronic component 110 to be mounted is a piezoelectric vibrator, connection electrodes are disposed at one end portion of the piezoelectric vibrator and no connection electrode is disposed at another end portion. Thus, the connection conductors 111 are disposed on upper surfaces of projecting parts 112 so that the connection conductors 111 can be mounted with a gap for avoiding contact with the mounting section 105 due to vibration, shock, or the like.

In the example according to the present embodiment, as the example in which the piezoelectric vibrator is used as the electronic component 110, the connection conductors 111 and the projecting parts 112 are disposed at the above-described positions. However, if mounting another electronic component or a plurality of other electronic components, the positions and shapes of the connection conductors 111 and the projecting parts 112 may be changed in accordance with the disposition of the other electronic component or the like. Examples of such other electronic component may include, for example, a piezoelectric element such as a ceramic piezoelectric element or a surface acoustic wave element, a semiconductor element, a capacitative element, a resistance element, and so forth.

The electronic component housing package 100 according to the present disclosure includes the base section 107, the projecting parts 112, the frame part 106, the frame-shaped metalized layer 113, the plurality of external connection conductors 108, the connection conductors 111, and the wiring conductors 116. The base section 107 includes a mounting section 105 for the electronic component 110. The projecting parts 112 are positioned on the base section 107 and project from the base sections 107. The frame part 106 is positioned on the base section 107 and surrounds the mounting section 105. The frame-shaped metalized layer 113 is positioned on the frame part 106. The plurality of external connection conductors 108 is positioned opposite the mounting section 105 in the thickness direction. The connection conductors 111 are positioned on the projecting parts 112 and for connecting to the electronic component 110. The wiring conductors 116 are connected to the connection conductors 111 and led out to the base section 107. The thickness of the connection conductors 111 gradually increases toward the wiring conductors 116.

With the above-described structure, in a pressure applying process for fabricating the superposed structure that becomes the matrix substrate including wiring substrate regions that become electronic component housing packages 100, the thickness of metallization paste that becomes the wiring conductors 116 is largest at regions around the projecting parts 112 where flowing of the metalizing paste is largest. Thus, spreading due to the flowing of the metallization paste can reduce the likelihood of the occurrences of breaks in wiring or reduction in conductive property. That is, even if the width of the connection conductors 111 on the projecting parts 112 is reduced due to size reduction of the electronic component housing package 100, the connection conductors 111 spread during formation of the projecting parts 112 in the pressure applying process. This can reduce the likelihood of the occurrences of breaks in wiring or reduction in conductive property.

Hereinafter, an example of fabrication of the electronic component housing package 100 according to the present disclosure is specifically described. In order to fabricate the electronic component housing package 100 in which the connection conductors 111 are positioned on the projecting parts 112 and which includes the wiring conductors 116 connected to the connection conductors 111 as described above, for example, a plurality of through holes that becomes the cutout portions 109 is formed, by punching, at four corners of each of the wiring substrate regions of each of the subset of the ceramic green sheets that become the base section 107. In each of the wiring substrate regions of the ceramic green sheet, the metallization paste that becomes the wiring conductors 116 is applied to predetermined positions by a screen printing method, and metallization paste is superposed on end portions of metallization paste so that the metallization paste that becomes the connection conductors 111 is similarly applied to predetermined positions. In so doing, the metallization paste is applied so as to ensure that regions where the metallization paste is superposed have a large width.

Next, the surface of the ceramic green sheet that becomes the base section 107 on which the metallization paste that becomes the connection conductors 111 is applied is subjected to pressure by using a pressure applying tool having recessed portions so that the connection conductors 111 project to form the projecting parts 112. Thus, the connection conductors 111 on which the electronic component 110 is to be mounted are exposed in the upper surfaces of the projecting parts 112. In addition, the wiring conductors 116 are led from peripheral portions of the connection conductors 111 toward the mounting section 105. If the ceramic green sheet is subjected to the pressure by using the pressure applying tool, the ceramic green sheet and the metallization paste flow in the recessed portions of the tool. Thus, a structure in which the thickness of the connection conductors 111 gradually increases from the side opposite the wiring conductors 116 toward the wiring conductors 116 can be obtained. Such a structure spreads the metallization paste that becomes the wiring conductors 116 during the formation of the projecting parts 112 in the pressure applying process. This can reduce the likelihood of the occurrences of breaks in wiring or reduction in conductive property.

The depth of the recessed portions of the pressure applying tool is uniform and the height of the projecting parts 112 after the pressure applying process can be uniform. Thus, compared to a method in which printing with the metallization paste on the mounting section 105 is performed a plurality of times so as to form metalized bumps to provide the connection conductors 111 as is the case with the related art, dimensional accuracy of the thickness of the connection conductors 111 can be improved. By superposing a corresponding one of the subset of the ceramic green sheets that becomes the frame part 106 on the ceramic green sheet on which the projecting parts 112 are disposed and which becomes the base section 107, the matrix substrate in which a plurality of the wiring substrate regions that becomes the electronic component housing packages 100 is arrayed can be produced.

In the above-described example, the frame part 106 and the base section 107 are separately formed and, after the projecting parts 112 have been formed by the pressure applying process, superposed on each other to produce the matrix substrate. However, if the thickness of the frame part 106 is comparatively small, the metallization paste that becomes the connection conductors 111 and the metallization paste that becomes the wiring conductors 116 may be applied to a single ceramic green sheet and the pressure may be applied to collectively form the projecting parts 112 and the frame part 106. With such a method, dimensional accuracy of the shape of the projecting parts 112 including the connection conductors 111 in the mounting section 105 can be improved by using a pressure applying tool with high dimensional accuracy. A single ceramic green sheet to which metallization paste that becomes, for example, the external connection conductors 108 or the like is applied may be superposed on the side to be connected to the module substrate 130 so as to produce the matrix substrate.

In the electronic component housing package 100 according to the present disclosure, the connection conductors 111 include inclined parts 117 inclined toward the wiring conductors 116. With such a structure, the connection conductors 111 on which the electronic component 110 is to be mounted are buried in the projecting parts 112 by using the inclined parts 117 in lower portions of the connection conductors 111. Thus, the electronic device 120 in which removal of the connection conductors 111 due to shocks from outside is suppressed and which exhibits good shock resistance can be realized.

Figure 3:
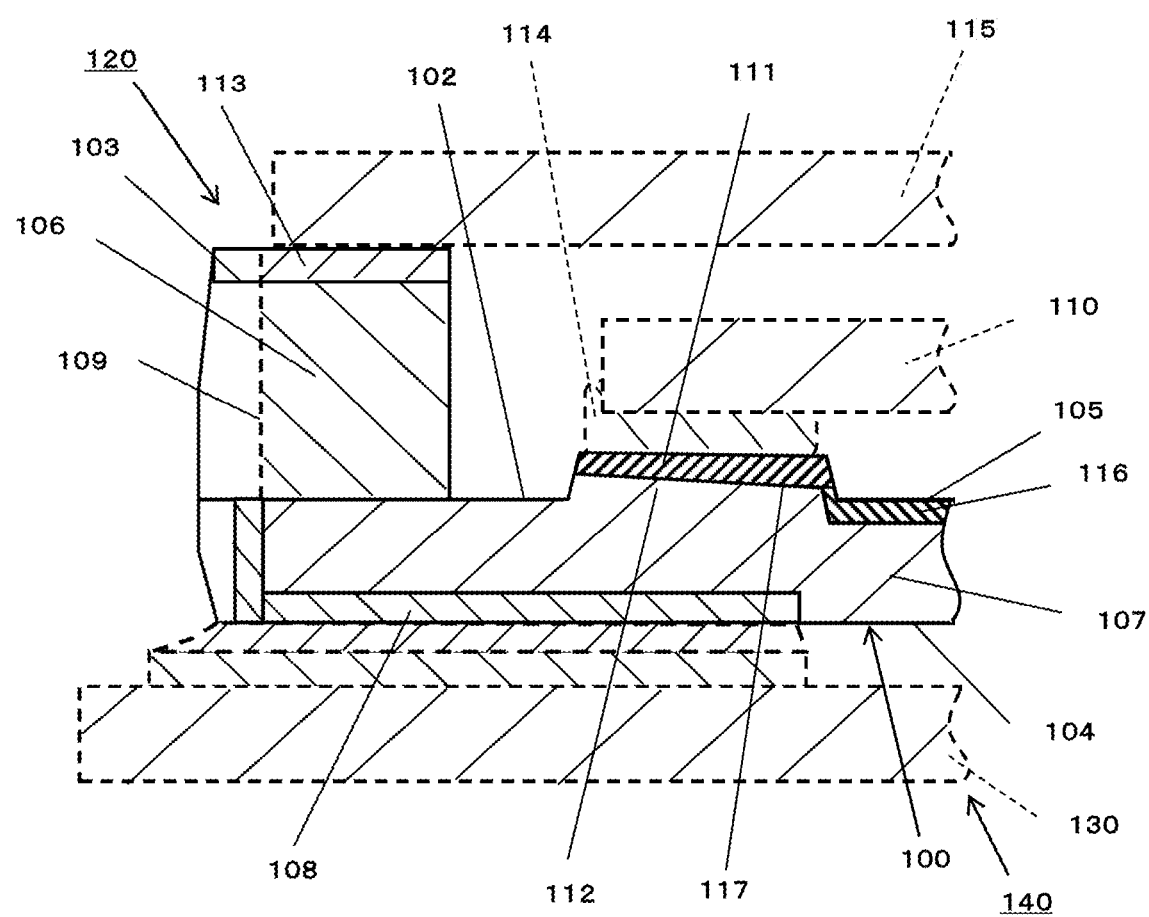
FIG. 3 is a longitudinal sectional view of a main portion illustrating the main portion of the electronic component housing package and so forth according to the present embodiment.

Specifically, in order to fabricate the electronic component housing package 100 illustrated in FIG. 3 in which the connection conductors 111 are positioned on the projecting parts 112 and which includes the wiring conductors 116 connected to the connection conductors 111 as described above, the pressure is applied, by using the pressure applying tool having recessed portions, to the surface of the ceramic green sheet that becomes the base section 107 on which the metallization paste that becomes the connection conductors 111 is applied, so that the connection conductors 111 project to form the projecting parts 112. As a result, the thickness of the connection conductors 111 and the wiring conductors 116 as conductors can be increased by using the inclined parts 117 at outer peripheries of the projecting parts 112, and the connection conductors 111 are buried in the projecting parts 112 by using the inclined parts 117 in the lower portions of the connection conductors 111. Accordingly, at outer peripheries of the connection conductors 111 on a side connected to the wiring conductors 116, even if the electronic component 110 is vibrated by shocks from outside and the outer peripheries of the connection conductors 111 are locally subjected to stress, removal of the connection conductors 111 from the projecting parts 112 is suppressed. If the electronic component 110 is, as is the case with the piezoelectric vibrator or the like, connected only at one end side as illustrated in FIG. 2, vibration of the electronic component 110 due to shocks from outside increases the likelihood of the stress being locally concentrated at the outer peripheries of the connection conductors 111 on the side connected to the wiring conductors 116. However, as described above, since the connection conductors 111 are buried in the projecting parts 112 by using the inclined parts 117 in the lower portions of the connection conductors 111, removal of the connection conductors 111 from the projecting parts 112 is suppressed. Thus, the electronic device 120 in which connection between the electronic component 110 and the connection conductors 111 is good and which exhibits good shock resistance can be realized.

For example, in metallization paste regions which become the connection conductors 111 and in which the metallization paste that becomes the wiring conductors 116 is applied and metallization paste is superposed on the end portions of the metallization paste, the width of the end portions of the metallization paste gradually reduces toward distal ends and the width of the inclined parts 117 gradually reduces from the wiring conductor 116 side toward the side opposite the wiring conductors 116. With this structure, if applying the pressure to the ceramic green sheet by using the pressure applying tool, since the width of the end portions of the metallization paste gradually reduces toward the distal end, burying of the inclined parts 117 is facilitated in the pressure applying process. As a result, the inclined parts 117 in which the thickness of the connection conductors 111 is more effectively buried in the projecting parts 112 can be provided in a region from the side opposite the wiring conductors 116 toward the wiring conductors 116. Since local concentration of the spreading of the metallization paste is reduced by the inclined parts 117, the likelihood of the occurrences of break in wiring or reduction in conductive property due to the spreading of the metallization paste that becomes the wiring conductors 116 can be effectively reduced in the formation of the projecting parts 112 by using the pressure applying process.

For improving positional accuracy in mounting the electronic component 110, it is desirable that the shape of the metallization paste for forming the connection conductors 111 on which the electronic component 110 is to be mounted do not change due to the pressure applying process. Thus, for suppressing the changes in shape in the pressure applying process, for example, a type of metallization paste containing a large amount of a solid of metal particles can be used. It is also desirable that the metallization paste that forms the wiring conductors 116 led from the connection conductors 111 improve fluidity in the pressure applying process so as to suppress breaks in wiring. Accordingly, for improving the fluidity in the pressure applying process, for example, a type of the metallization paste containing a reduced amount of a solid of the metal particles and an increased amount of binder can be used. In this way, the electronic component housing package 100 which exhibits a good forming property of the projecting parts 112 in the pressure applying process and in which the shape of the connection conductors 111 is maintained and breaks in the wiring conductors 116 is suppressed in the pressure applying process can be fabricated.

In the electronic component housing package 100 according to the present disclosure, the wiring conductors 116 are covered with an insulating layer 118 except for portions thereof at the side surfaces of the projecting parts 112. With the structure as described above, even if the width of the wiring conductors 116 extending from the connection conductors 111 at the projecting parts 112 is significantly reduced due to size reduction of the electronic component housing package 100, spreading of the metallization paste that becomes the wiring conductors 116 is reduced by being held by this insulating layer 118 during formation of the projecting parts 112 in the pressure applying process. This can reduce the likelihood of the occurrences of breaks or reduction in conductive property in the wiring conductors 116 on the first main surface 102 of the mounting section 105.

Also with the structure as described above, even if the size of the electronic component housing package 100 is reduced, shorting between the connection conductors 111 to which the electronic component 110 is connected and other wiring conductors can be suppressed. That is, since high dimensional accuracy as the connection conductors 111 can be obtained and the wiring conductors 116 at the base section 107 are covered with the insulating layer 118, shorting with other surrounding wiring conductors such as, for example, other connection conductors or wiring conductors on the first main surface 102 of the mounting section 105 (not illustrated) can be suppressed. Furthermore, if the joining material 114 flows during, for example, joining of the electronic component 110, shorting with other wiring conductors can be suppressed and the electronic component housing package 100 in which the electronic component 110 exhibits good reliability in attachment can be realized.

Figure 4:
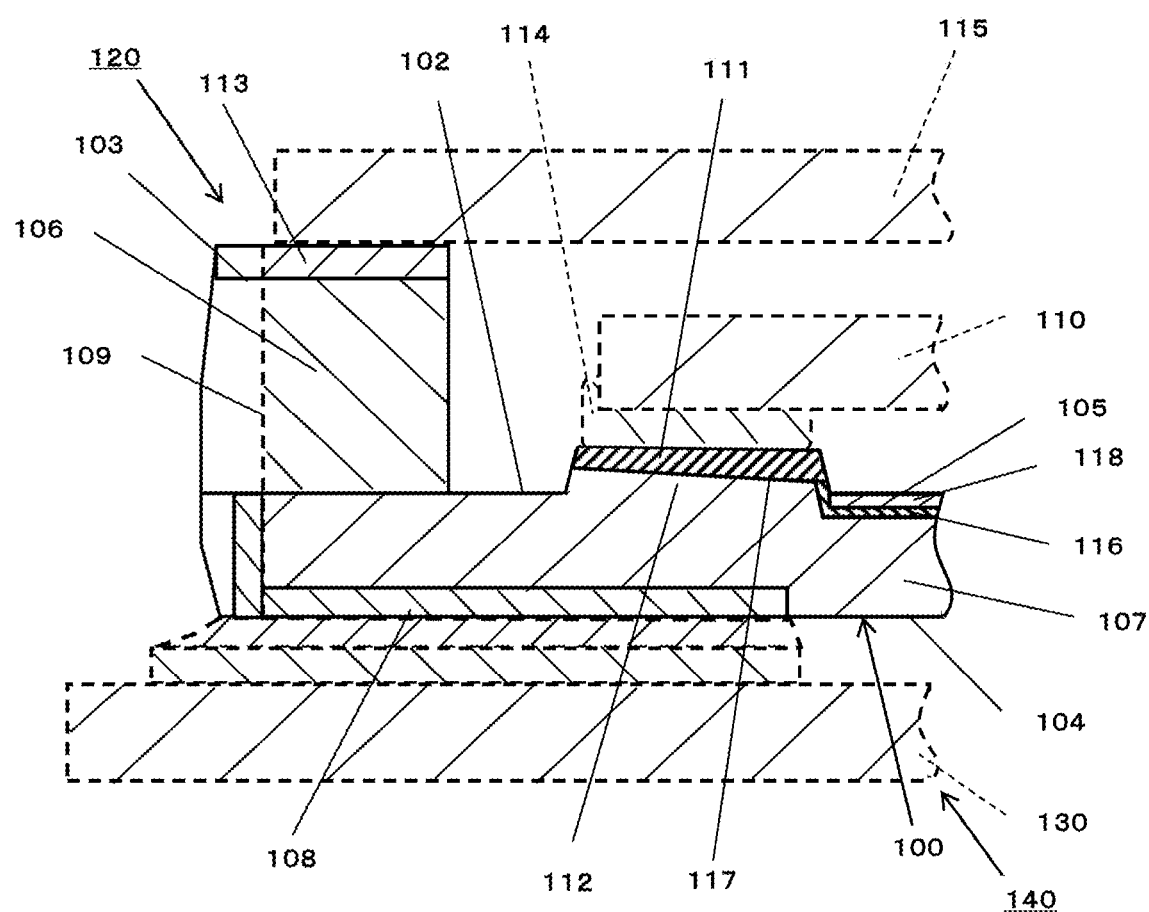
FIG. 4 is a longitudinal sectional view of a main portion illustrating another example of the electronic component housing package and so forth according to the present embodiment.

FIG. 4 illustrates an enlarged view of a main portion of the electronic component housing package 100 in which, as described above, the wiring conductors 116 are covered with the insulating layer 118 except for the portions thereof at the side surfaces of the projecting parts 112. In order to fabricate such an electronic component housing package 100, for example, the metallization paste that becomes the wiring conductors 116 is, in each of the wiring substrate regions of the ceramic green sheet, applied to predetermined positions by the screen printing method, and further, the metallization paste is superposed on the end portions of the metallization paste so that the metallization paste that becomes the connection conductors 111 is similarly applied to the predetermined positions. Furthermore, ceramic paste that becomes the insulating layer 118 is applied to a predetermined position by a screen printing method so as to cover the metallization paste that becomes the wiring conductors 116. In so doing, after the ceramic paste that becomes the insulating layer 118 has been applied except for the portions that become the side surfaces of the projecting parts 112, the pressure can be applied, by using the pressure applying tool having recessed portions, so that the connection conductors 111 project from the base section 107 to form the projecting parts 112. Thus, the connection conductors 111 on which the electronic component 110 is to be mounted are exposed in the upper surfaces of the projecting parts 112. In addition, the wiring conductors 116 covered with the insulating layer 118 except for the portions thereof at the side surfaces of the projecting parts 112 are provided from the peripheral portions of the connection conductors 111.

Here, the reason for applying the ceramic paste that becomes the insulating layer 118 except for the portions that become the side surfaces of the projecting parts 112 is to suppress substantial reduction of the area to be connected to the electronic component 110 due to covering of part of the connection conductors 111 as a result of spreading of the metallization paste that becomes the wiring conductors 116 and the ceramic paste that becomes the insulating layer 118 if the projecting parts 112 are formed in the pressure applying process. It is desirable that the ceramic paste be formed by the substantially same material as that of the insulating substrate 101. The term "same material" refers to a material containing the same ceramic component as that of the insulating substrate 101 after firing. Amounts to add a binder and a solvent mixed with the ceramic are adjusted in accordance with specifications of a method of applying the ceramic paste (for example, the screen printing or the like).

In order to fabricate the electronic component housing package 100, the matrix substrate may be produced by separately forming the frame part 106 and the base section 107 and superposing the frame part 106 and the base section 107 on each other after the projecting parts 112 have been formed in the pressure applying process. If the thickness of the frame part 106 is comparatively small, the metallization paste that becomes, for example, the connection conductors 111 and, for example, the ceramic paste that becomes the insulating layer 118 may be formed in a single ceramic green sheet and the pressure may be applied to collectively form recesses that become the projecting parts 112 and the frame part 106. The matrix substrate may be produced by superposing a single ceramic green sheet to which the metallization paste that becomes, for example, the external connection conductors 108 or the like is applied on the side to be connected to the module substrate 130. With such a method, in the mounting section 105, dimensional accuracy of the connection conductors 111 and dimensional accuracy of the shape of the projecting parts 112 including the connection conductors 111 can be improved by using the pressure applying tool with high dimensional accuracy.

The electronic device 120 according to the present disclosure includes the electronic component housing package 100 of any one of the above descriptions and the electronic component 110 mounted in the electronic component housing package 100. With such a structure, the connection conductors 111 on which the electronic component 110 is mounted are buried in the projecting parts 112 by using the inclined parts 117 in lower portions of the connection conductors 111. Thus, removal of the connection conductors 111 due to shocks from outside is suppressed and good shock resistance is obtained.

Specifically, the thickness of the connection conductors 111 and the wiring conductors 116 as conductors can be increased by using the inclined parts 117 at the outer peripheries of the projecting parts 112, and the connection conductors 111 are buried in the projecting parts 112 by using the inclined parts 117 in the lower portions of the connection conductors 111. Thus, the area for joining to the projecting parts 112 that is the total of rear surfaces of the connection conductors 111 and rear surfaces of the inclined parts 117 is large. Accordingly, the connection conductors 111 and the inclined parts 117 can be disposed at the projecting parts 112. Thus, the electronic device 120 in which removal of the connection conductors 111 due to shocks from outside is suppressed and which exhibits good shock resistance can be realized.

Furthermore, as illustrated in FIG. 4, if the wiring conductors 116 are covered with the insulating layer 118 except for the portions thereof at the side surfaces of the projecting parts 112 in the electronic component housing package 100, connectivity between the electronic component 110 and the connection conductors 111 can be maintained in a good state and shorting with surrounding wiring conductors or the like can be suppressed. That is, even if the wiring conductors 116 are led from the outer peripheries of the projecting parts 112 to an outer periphery of the electronic component housing package 100, shorting with the surrounding wiring conductors or the like can be suppressed with the wiring conductors 116 covered with the insulating layer 118. Since a gap is provided between the projecting parts 112 and an inner wall of the frame part 106, if the joining material 114 flows during, for example, joining of the electronic component 110, shorting with the frame-shaped metalized layer 113 can be suppressed and the electronic device 120 in which the electronic component 110 exhibits good reliability in connection can be provided.

An electronic module 140 according to the present disclosure includes the above-described electronic device 120 and the module substrate 130 to which the electronic device 120 is connected. With such a structure, the electronic module 140 exhibiting good reliability in operation can be provided. The electronic device 120 that is mounted in this electronic module 140 exhibits good electrical connectivity, through the wiring conductors 116 or the like, with the connection conductors 111 to which the electronic component 110 housed in the electronic component housing package 100 is connected.

The electronic module 140 which exhibits good reliability in operation and in which the electronic device 120 is mounted can be provided. Specifically, in the electronic device 120, the connection conductors 111 and the inclined parts 117 are disposed in the projecting parts 112, the electronic component 110 such as a piezoelectric vibrator is joined to the connection conductors 111 in the upper surfaces of the projecting parts 112 by using the joining material 114, the inclined parts 117 in lower portions of the connection conductors 111 are buried in the projecting parts 112, and breaks or reduction in conductive property in the wiring conductors 116 led from the outer peripheries of the projecting parts 112 to the outer periphery of the electronic component housing package 100 is suppressed.

Furthermore, even if the size and the height of the electronic component housing package 100 are reduced, shorting between the connection conductors 111 to which the electronic component 110 is connected and the frame-shaped metalized layer 113 can be suppressed. Specifically, since the connection conductors 111 are disposed in the projecting parts 112 with high dimensional accuracy, shorting with the surrounding wiring conductors or the like can be suppressed. Since a gap is provided between the projecting parts 112 and the inner wall of the frame part 106, if the joining material 114 flows during, for example, joining of the electronic component 110, shorting with the frame-shaped metalized layer 113 can be suppressed, and the electronic module 140 exhibiting good reliability in operation in which the electronic device 120 including the electronic component 110 exhibiting good reliability in connection is mounted can be provided.

The present disclosure is not limited to the above-described example according to the embodiment and can be changed in various manners without departing from the gist of the present disclosure. For example, in the above-described example according to the embodiment, the projecting parts 112, the connection conductors 111, and the like form pairs and are disposed near the short side of the insulating substrate 101. However, the positions and the numbers of the projecting parts 112, the connection conductors 111, and the like may be changed in accordance with, for example, the type, the number of terminals, and the shape of the electronic component to be mounted on the mounting section 105. The cutout portions 109 are disposed at four corner portions of the electronic component housing package 100. However, the projecting parts 112, the connection conductors 111, and the like may be disposed at the long side or both the short and the long sides of the electronic component housing package 100 without the cutout portions 109 at the four corner portions of the electronic component housing package 100, and the electronic component may be connected onto these connection conductors 111.

The invention claimed is:

1. An electronic component housing package, the package comprising:
    a base section that comprises a mounting section for an electronic component;
    a projecting part that is positioned on the base section and projects from the base section;
    a frame part that is positioned on the base section and surrounds the mounting section;
    a frame-shaped metalized layer that is positioned on the frame part;
    a plurality of external connection conductors that is positioned opposite the mounting section in a thickness direction;
    a connection conductor which is positioned on the projecting part and for connecting to the electronic component via a joining material; and
    a wiring conductor that is connected to the connection conductor and that is led out to the base section, wherein
    the connection conductor comprises an inclined part that is inclined toward the wiring conductor in a lower portion of the connection conductor, and
    a thickness of the connection conductor gradually increases toward the wiring conductor.

2. The electronic component housing package according to claim 1, wherein
    the wiring conductor is covered with an insulating layer except for a portion thereof at a side surface of the projecting part.

3. An electronic device comprising:
    the electronic component housing package according to claim 1; and
    an electronic component that is mounted in the electronic component housing package.

4. An electronic module comprising:
    the electronic device according to claim 3; and
    a module substrate to which the electronic device is connected.

5. An electronic device comprising:
    the electronic component housing package according to claim 2; and
    an electronic component that is mounted in the electronic component housing package.

6. An electronic module comprising:
    the electronic device according to claim 5; and
    a module substrate to which the electronic device is connected.

7. The electronic component housing package according to claim 1, wherein
    the inclined part of the connection conductor is buried in the projecting part.

* * * * *